United States Patent [19]
Mecier et al.

[11] Patent Number: 6,023,429
[45] Date of Patent: Feb. 8, 2000

[54] METHOD AND APPARATUS FOR GENERATING A SIGNAL WITH A VOLTAGE INSENSITIVE OR CONTROLLED DELAY

[75] Inventors: Richard A. Mecier; Brendan N. Protzman, both of Boise, Id.

[73] Assignee: Micron Technology, Inc., Boise, Id.

[21] Appl. No.: 09/092,322

[22] Filed: Jun. 5, 1998

[51] Int. Cl.⁷ ........................................................ G11C 7/00
[52] U.S. Cl. ........................ 365/194; 365/226; 365/189.09
[58] Field of Search ..................................... 365/194, 226, 365/189.09, 189.11; 318/444

[56] References Cited

U.S. PATENT DOCUMENTS

| | | | |
|---|---|---|---|
| 5,124,597 | 6/1992 | Stuebing et al. | 307/601 |
| 5,559,796 | 9/1996 | Edem et al. | 370/60 |
| 5,789,886 | 8/1998 | Ivice | 318/444 |

*Primary Examiner*—David Nelms
*Assistant Examiner*—Thong Le
*Attorney, Agent, or Firm*—Dorsey & Whitney LLP

[57] ABSTRACT

A delay circuit that generates an output signal responsive to an input signal after a delay corresponding to a reference voltage that is insensitive to the power supply voltage. The output signal switches between ground and the power supply voltage ($V_{CC}$). The delay circuit is formed by a timer circuit and a level translator circuit. The delay circuit provides an output signal having a delay of a fixed time period regardless of fluctuations or changes in the supply voltage. The level translator circuit provides an output signal with the aforementioned delay that has a magnitude of either the power supply voltage or ground. The timer circuit includes a capacitor that is charged and discharged through respective transistors to provide the delay. The level translator circuit includes transistors that switch the output signal between the supply voltage and ground.

37 Claims, 3 Drawing Sheets

METHOD AND APPARATUS FOR GENERATING A SIGNAL WITH A VOLTAGE INSENSITIVE OR CONTROLLED DELAY

TECHNICAL FIELD

The present invention relates to delay circuits and more particularly, to a delay circuit that generates a signal with a delay that may be either insensitive to supply voltage variations or may be controlled by an externally supplied control voltage.

BACKGROUND OF THE INVENTION

Delay circuits conventionally use resistor-capacitor ("RC") circuits to which a voltage is applied at a start of the delay period. The time required for the capacitor to charge or discharge through the resistor to a predetermined voltage establishes the delay of the delay circuit.

In the past, the voltage applied to the capacitor through the resistor has generally been the power supply voltage ($V_{CC}$). In many circumstances the supply voltage may fluctuate, thereby changing the magnitude of the delay produced by the delay circuit. FIG. 1 is a graph showing the voltage on a capacitor as a function of time as the capacitor is charged through a resistor toward two different charging voltages. As seen in FIG. 1, the capacitor charges toward a voltage $V_{CC1}$, and the voltage on the capacitor passes through a threshold voltage $V_T$ at a time $t_2$. When the capacitor is charged toward a higher voltage $V_{CC2}$, the voltage on the capacitor passes through the threshold voltage $V_T$ at an earlier time $t_1$. In conventional delay circuits, a delayed output signal is generated when the voltage on the capacitor exceeds the threshold voltage $V_T$. Thus, where $V_{CC}$ is the supply voltage for the delay circuit, a change in the magnitude of the supply voltage changes the magnitude of the delay at which the delay signal is generated.

It is not unusual for $V_{CC}$ to vary during the normal operation of a circuit. This typically occurs when different loads are applied and removed, thereby varying the impedance seen by the power supply. In this instance, if a delay circuit uses $V_{CC}$ to charge and discharge a capacitor to create a delay, the variation in $V_{CC}$ due to the changing load will create a varying delay period. Also, integrated circuits may be operable over a range of supply voltages. For example, a computer made by one manufacturer may use a power supply voltage of 3.3 volts, while a second manufacturer may use a 5 volt supply. Due to the difference in power supply voltages, an integrated circuit containing a conventional delay circuit used in the first manufacturer's computer would reach a given threshold voltage at a different point in time, producing a different delay period, than if an integrated circuit containing the same delay circuit was used in the computer made by the second manufacturer. Again, this is illustrated in FIG. 1, discussed above. However, it is generally desirable for the performance of the integrated circuit to be unaffected by the specific supply voltage value chosen by the manufacturer to power the integrated circuit.

Some delay circuits attempt to overcome these problems by applying a regulated voltage other than $V_{CC}$ to the RC delay circuit to produce a fixed delay period. However, the problem with this solution is that the delayed output voltage is no longer between a first voltage (usually ground) and $V_{CC}$. The output voltage in these instances varies between the first voltage and the regulated voltage. This presents a problem because the circuit that receives the delayed signal usually changes states or produces a result when the delayed signal reaches close to the supply voltage. When the regulated voltage is different from $V_{CC}$, the delayed signal may fail to ever reach a voltage that causes the downstream circuit to change state.

The variation in delay time is a particular problem in semiconductor devices. The accuracy of timing functions in semiconductor devices is often very critical, particularly at high operating speeds. Yet the semiconductor devices must be useable over a range of power supply voltages, and the stability of the power supply voltage may, at times, be marginal.

There is therefore a need to be able to provide a precisely controlled delay in semiconductor circuits despite variations in the magnitude of the supply voltage.

SUMMARY OF THE INVENTION

The present invention provides a method and apparatus for producing an output signal that is a delayed version of the input signal, with the duration of the delay unaffected by the supply voltage and any fluctuations in supply voltage. According to one embodiment of the invention, a delay circuit receives an input signal, a reference voltage, and a first and second supply voltages. The delay circuit produces an output signal in response to receiving the input signal, the output signal being generated after a delay having a magnitude that corresponds to the reference voltage, and the output signal having a magnitude that corresponds to either the first or second supply voltage. The magnitude of the delay is insensitive to the magnitude of the supply voltages, and can be varied by changing the magnitude of the reference voltage.

DETAILED DESCRIPTION OF THE INVENTION

Figure 1:
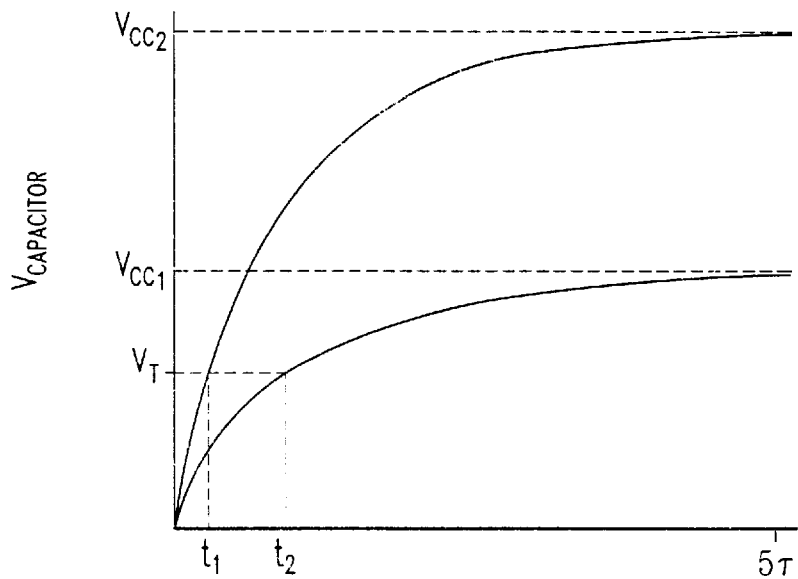
FIG. 1 is a graph of capacitor voltage over time with a varying charging voltage.
Figure 2:
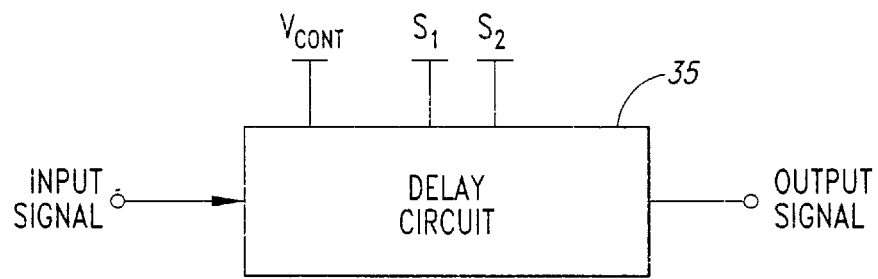
FIG. 2 is a functional block diagram of a delay apparatus in accordance with two possible embodiments of the invention.

FIG. 2 is a functional block diagram of an embodiment of a delay circuit 35 in accordance with the invention. The delay circuit 35 receives an input signal, a control voltage ($V_{CONT}$), a first supply voltage ($S_1$), and a second supply voltage ($S_2$). The delay circuit 35 produces an output signal in response to receiving the input signal after a delay having a magnitude that corresponds to the control voltage. The output signal has a magnitude that switches between the first and second supply voltages. Significantly, the magnitude of the delay is insensitive to the magnitude of the supply voltages.

In an alternate embodiment, the delay circuit 35 functions as described above, except that the delay circuit 35 produces the output signal after a delay when the input signal switches from a first input voltage to a second input voltage. The delay circuit 35 produces the output signal without the delay when the input signal switches from the second input voltage to the first input voltage.

Figure 3:
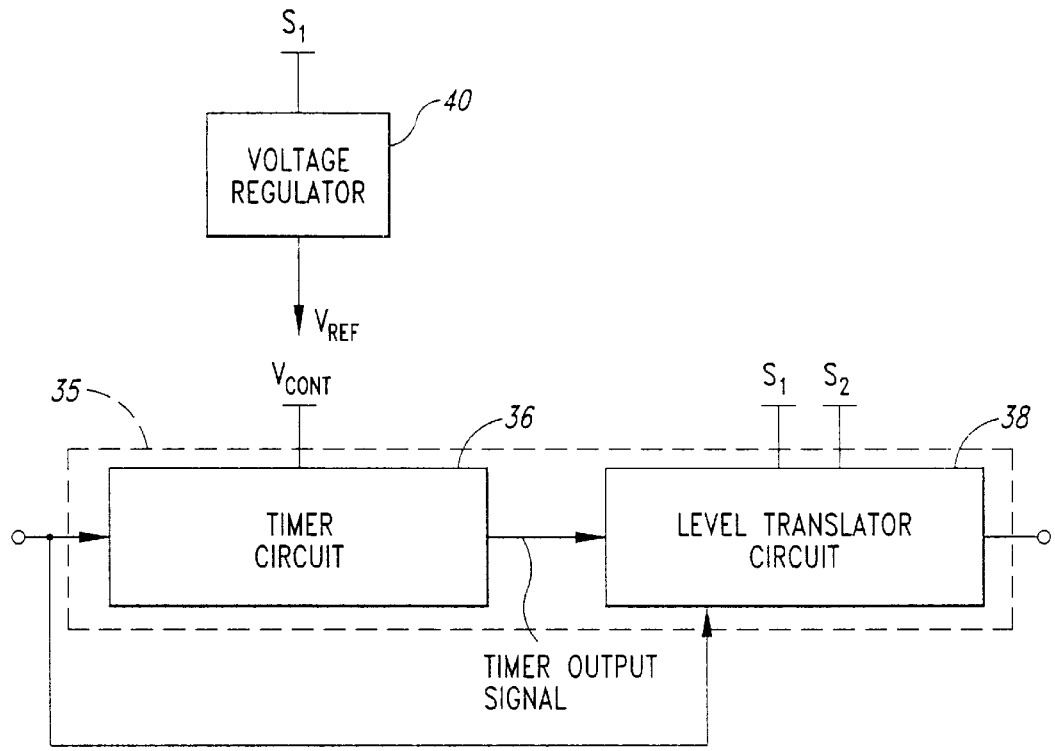
FIG. 3 is a more detailed functional block diagram of a delay apparatus in accordance with two possible embodiments of the invention.

FIG. 3 is a functional block diagram of one embodiment of the delay circuit 35 of FIG. 2. The delay circuit 35 includes a timer circuit 36 and a level translator circuit 38.

The timer circuit 36 receives the input signal and the control voltage ($V_{CONT}$) and produces a timer output signal in response to receiving the input signal. The timer output signal has a magnitude that varies between ground and the magnitude of the control voltage, and a delay from a transition of the input signal in a first direction that corresponds to the magnitude of the control voltage. Significantly, the magnitude of the delay is insensitive to the magnitude of the supply voltages.

The level translator circuit 38 receives the input signal and the timer output signal and produces an output signal in response. The output signal transitions between the first and second supply voltages ($S_1$, $S_2$) in one direction responsive to a transition of the input signal in a second direction and in the opposite direction responsive to a transition of the timer output signal. As explained above, the timer output signal is generated responsive to a transition of the input signal in the first direction after a delay that corresponds to the magnitude of the reference voltage. The first and second supply voltages are typically ground and $V_{CC}$ respectively.

In an alternate embodiment, the timer circuit 36 and the level translator circuit 38 function generally as described above. However, the level translator circuit 38 generates the output signal responsive to a transition of the timer output signal in one direction, and also generates the output signal responsive to a transition of the input signal in a second direction. Significantly, the timer output signal is not used to generate the output signal in response to the input signal transitioning in the second direction. Thus, the level translator circuit 38 generates the output signal with no delay when the input signal transitions in the second direction. The remainder the of the circuitry functions generally as described above, and will not be described further in the interest of brevity.

The delay circuit 35 may be used in either of two modes. In a first mode, a regulated voltage $V_{REF}$ is generated by a voltage regulator 40 from one of the supply voltages $S_2$. As is well known in the art, the regulated voltage generated by the voltage regulator 40 is constant despite variations in the magnitude of the supply voltage $S_2$. The regulated voltage $V_{REF}$ is used as the control voltage $V_{CONT}$ so that the magnitude of the delay provided by the timer circuit 36 is likewise insensitive to variations in the supply voltages $S_1$, $S_2$.

In a second mode, the control voltage $V_{CONT}$ has a magnitude that varies with the desired delay magnitude. The delay circuit 35 can thus be used as a voltage controlled delay circuit.

Figure 4:
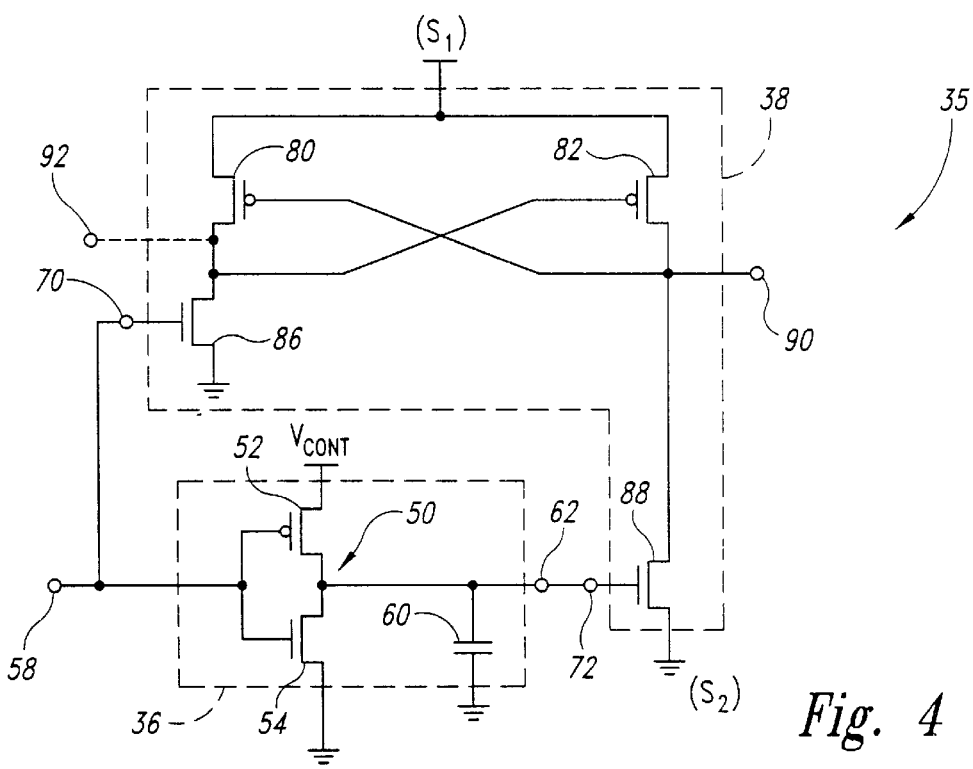
FIG. 4 is a schematic representation of a delay apparatus in accordance with two possible embodiments of the invention.

One embodiment of the delay circuit 35 of FIG. 3 is illustrated in the FIG. 4. The timer circuit 36 includes an inverter 50 formed by a PMOS transistor 52 and an NMOS transistor 54 that have their gates coupled to each other and to a delay circuit input terminal 58. The drains of the transistors 52, 54 are connected to each other as well as to a capacitor 60 and a timer output terminal 62.

In operation, the timer circuit 36 receives a delay circuit input signal that transitions between ground and a positive voltage. The positive voltage has a magnitude that is at least equal to the magnitude of a control voltage $V_{CONT}$. When the delay circuit input signal transitions from ground to the positive voltage, the PMOS transistor 52 turns OFF while the NMOS transistor 54 turns ON thereby discharging the capacitor 60. However, because the NMOS transistor 54 has a significant channel resistance, the NMOS transistor 54 requires substantial time to discharge the capacitor 60 to ground. When the delay circuit input signal transitions from the positive voltage to ground, the NMOS transistor 54 turns OFF while the PMOS transistor 52 turns ON. The capacitor 60 is then charged toward the control voltage $V_{CONT}$ through the PMOS transistor 52. Again, because of the significant channel resistance of the PMOS transistor 52, the capacitor 60 requires a substantial time to charge to the control voltage $V_{CONT}$. In summary, a timer circuit output signal at the output terminal 62 increases exponentially toward the control voltage $V_{CONT}$ responsive to the delay circuit input signal transitioning to ground. The timer circuit output signal decreases exponentially toward ground responsive to the delay circuit input signal transitioning to the positive voltage.

The level translation circuit 38 has a first input terminal 70 that is coupled to the delay circuit input terminal 58, and a second input terminal 72 is coupled to the timer circuit output terminal 62. The level translation circuit 38 includes a pair of cross-coupled PMOS transistors 80, 82 having their sources connected to each other and to a first supply voltage $S_1$. The drain of each PMOS transistor 80, 82 is connected to a second supply voltage $S_2$, e.g., ground potential, through a respective NMOS transistor 86, 88. The drain of the PMOS transistor 82 is also connected to a delay circuit output terminal 90.

In operation, the NMOS transistor 86 turns ON responsive to the delay circuit input signal applied on the input terminal 70 transitioning to the positive voltage. In response, the drain of the NMOS transistor 86 is pulled to ground, thereby turning ON the PMOS transistor 82. The ON PMOS transistor 82 then couples the delay circuit output terminal 90 to the first supply voltage, $S_1$. However, as explained above, when the positive voltage is applied to the timer circuit 36, the timer circuit output signal at the output terminal 62 does not immediately transition low. As a result, the timer circuit 36 does not immediately turn OFF the NMOS transistor 88. Instead, the NMOS transistor 88 remains ON until the capacitor 60 has discharged to the transition voltage of the NMOS transistor of 88. The NMOS transistor 88 is fabricated with a channel resistance that is significantly lower than the channel resistance of the PMOS transistor 82. Thus, the delay circuit output signal developed at the output terminal 90 is controlled by the state of the NMOS transistor 88 rather than by the PMOS transistor 82, which instead only serves to bias the output terminal 90 to $S_1$. As a result, a delay circuit output signal generated at the output terminal 90 does not transition to $S_1$ from ground until the timer circuit 36 times out.

When the input signal applied to the input terminal 58 transitions from the positive voltage to ground, the capacitor 60 is charged through the PMOS transistor 52, as explained above. At the same time, the NMOS transistor 86 is turned OFF, although the voltages on the drains of the PMOS transistors 80, 82 remain constant because the transistors 80, 82 are cross-coupled. When the capacitor 60 is charged to the threshold voltage of the NMOS transistor 88, the NMOS transistor 88 turns ON, thereby pulling the delay circuit output signal at the output terminal 90 to ground. When the NMOS transistor 88 turns ON, it also turns ON the PMOS transistor 80 which then pulls the gate of the PMOS transistor 82 to the supply voltage $S_1$, thereby turning the PMOS transistor 82 OFF. Thus, in response to the delay circuit input signal applied to the input terminal 58 transitioning low, the delay circuit output signal at the output terminal 90 transitions low after the timer circuit 36 has timed out. The delay circuit output signal thus corresponds to the delay circuit input signal with a delay determined by the time constant of the capacitor 60 and the channel resistances of the transistors 52, 54. Significantly, the delay of the timer circuit 36 is not a function of the supply voltage $S_1$ even though the delay circuit output signal transitions between $S_2$ (ground) and the supply voltage $S_1$.

In an alternate embodiment, also shown in FIG. 4, the level translator circuit 38 is configured as described above, except the an output terminal 92 is coupled to the drain of the PMOS transistor 80. In this embodiment the output terminal 90 need not be present. The timer circuit 36 functions as described above, and will not be repeated in the interest of brevity.

When the delay circuit input signal applied to the delay circuit input terminal 58 transitions from ground to the positive voltage, the NMOS transistor 86 turns ON, coupling the output terminal 92 to the second supply voltage $S_2$ (ground). The NMOS transistor 86 is fabricated with a channel resistance that is significantly lower than the channel resistance of the PMOS transistor 80. Thus, although the PMOS transistor 80 remains ON until the timer circuit output signal transitions low after a delay due to the timer circuit 36, as explained above, the delay circuit output signal transitions low immediately upon the delay circuit input signal transitioning high.

When the input signal applied to the input terminal 58 transitions from the positive voltage to ground, the NMOS transistor 86 turns OFF immediately. As explained above, the PMOS transistor 80 remains OFF until the timer circuit output signal transitions high, turning ON the NMOS transistor 88. The remainder of the level translation circuit 38 functions as described above, and will not be repeated in the interest of brevity. Thus, the delay circuit output signal transitions high only after a delay from the delay circuit input signal transitioning low.

Figure 5:
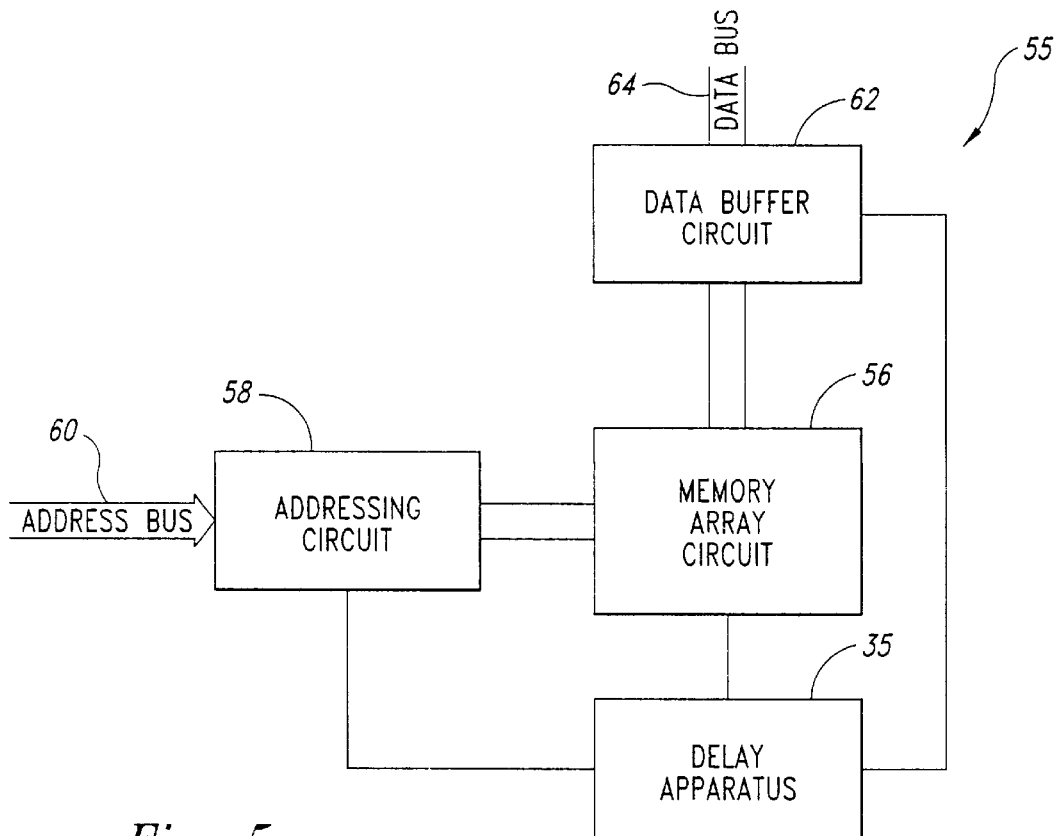
FIG. 5 is a functional block diagram showing the delay apparatus of FIG. 2 used in a typical integrated memory circuit.

The delay circuits 35 of FIGS. 2–4 can be used in an integrated memory device 55, which is illustrated in general form in FIG. 5. The integrated memory device 55 includes a memory array circuit 56 containing a large number of memory cells, each of which stores one bit of data. A particular cell or group of cells in the array is selected by an addressing circuit 58 (which may include buffers and decoders) as a function of an address received on an address bus 60. Data routed through a data buffer circuit 62 to or from a data bus 64 is then either written into or read from the memory array circuit 56. The timing of these operations is critical, and often requires a signal to be delayed before propagating through the circuitry so that other portions of the circuit can reset or otherwise be ready to act on the signal. Those skilled in the art will recognize that these delays can be effected by the delay circuit 35.

Figure 6:
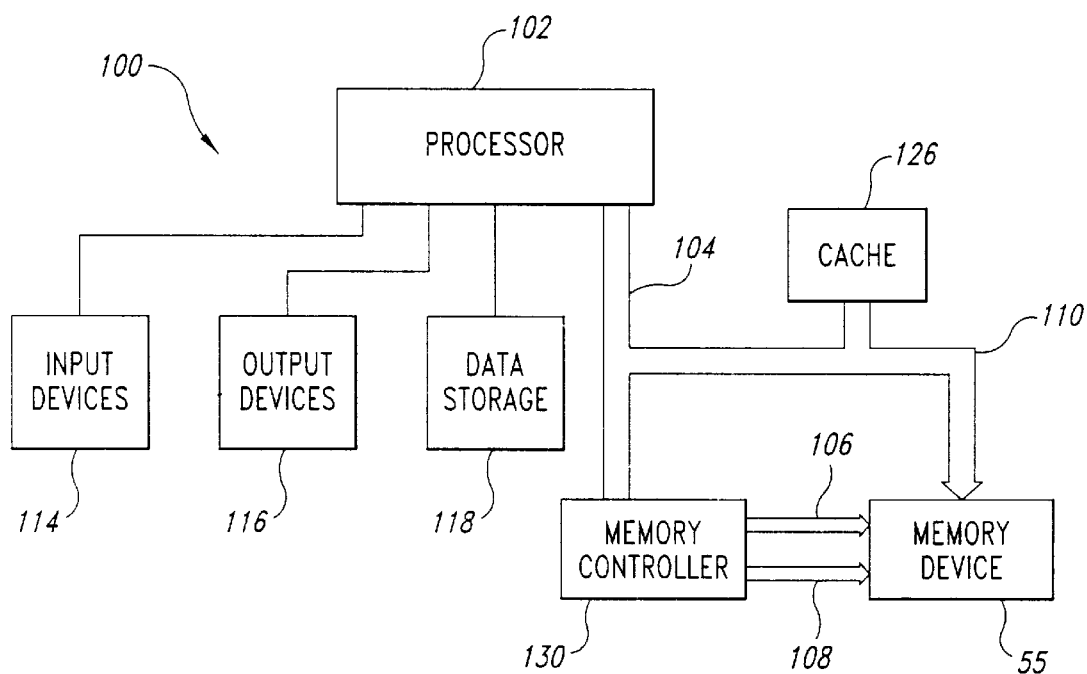
FIG. 6 is a functional block diagram showing the integrated memory circuit of FIG. 5 used in a computer system.

FIG. 6 is a block diagram of a computer system 100 which includes the memory device 55 of FIG. 5. The computer system 100 includes a processor 102 for performing various computing functions, such as executing specific software to perform specific calculations or tasks. The processor 102 includes a processor bus 104 that normally includes an address bus 106, a control bus 108, and a data bus 110. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM") and to the memory device 55 through a memory controller 130. The memory controller 130 normally includes the control bus 108 and the address bus 106 that is coupled to the memory device 55. The data bus 110 may be coupled to the processor bus 104 either directly (as shown), through the memory controller 130, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A delay circuit, comprising:
    a timer circuit having an input terminal adapted to receive a delay circuit input signal, a control terminal adapted to receive a control voltage, and an output terminal, the timer circuit being constructed to generate on the output terminal a timer output signal that transitions from a first output voltage to a second output voltage following a transition of the delay circuit input signal from a first input voltage to a second input voltage by a delay that is a function of the magnitude of the control voltage; and
    a level translation circuit having an input terminal coupled to the output terminal of the timer circuit, an output terminal, and first and second supply terminals adapted to receive first and second supply voltages, respectively, the level translation circuit being constructed to generate a delay circuit output signal that transitions from the first supply voltage to the second supply voltage responsive to a transition of the timer output signal from the first output voltage to the second output voltage.

2. The delay circuit of claim 1 wherein the level translation circuit comprises a first switch having a control terminal coupled to the output terminal of the timer circuit, the first switch being constructed to couple the output terminal of the level translation circuit to the first supply voltage responsive to a timer output signal of the first output voltage, and to isolate the output terminal of the level translation circuit from the first supply voltage responsive to a timer output signal of the second output voltage.

3. The delay circuit of claim 2 wherein the level translation circuit further comprises a bias circuit coupled to the input terminal of the delay circuit and the output terminal of the translation circuit, the bias circuit being constructed to bias the output terminal of the level translation circuit to the second supply voltage responsive to a transition of the delay circuit input signal from the first input voltage to the second input voltage.

4. The delay circuit of claim 1 wherein the timer circuit is further constructed to generate on the output terminal a timer output signal that transitions from the second output voltage to the first output voltage following a transition of the delay circuit input signal from the second input voltage to the first input voltage by a second delay that is a function of the magnitude of the control voltage.

5. The delay circuit of claim 4 wherein the level translation circuit is further constructed to generate a delay circuit output signal that transitions from the second supply voltage to the first supply voltage responsive to a transition of the timer output signal from the second output voltage to the first output voltage.

6. The delay circuit of claim 1, further comprising a voltage regulator generating a reference voltage from one of the first and second supply voltages, the magnitude of the reference voltage being insensitive to variations in the first and second supply voltages, the reference voltage being coupled to the control input of the timer circuit.

7. The delay circuit of claim 1 wherein the first output voltage comprises a positive voltage and the second output voltage comprises zero volts.

8. The delay circuit of claim 7 wherein the first input voltage comprises zero volts and the second input voltage comprises a positive voltage.

9. The delay circuit of claim 1 wherein the delay circuit output signal transitions from the second supply voltage to the first supply voltage responsive to a transition of the delay circuit input signal from the second input voltage to the first input voltage.

10. The delay circuit of claim 9 wherein the first input voltage comprises a positive voltage and the second input voltage comprises zero volts.

11. The delay circuit of claim 9 wherein the first supply voltage comprises zero volts and the second supply voltage comprises a positive voltage.

12. A delay circuit, comprising:
a timer circuit having an input terminal adapted to receive a delay circuit input signal, a control terminal adapted to receive a control voltage, and an output terminal, the timer circuit comprising:
a capacitor having a first terminal coupled to the output terminal of the timer circuit;
a first switch coupled between the first terminal of the capacitor and the control terminal of the timer circuit, the first switch having a control input that is coupled to the input terminal of the timer circuit, the first switch being constructed to be conductive responsive to the delay circuit input signal having a first logic level and to be non-conductive responsive to the delay circuit input signal having a second logic level;
a second switch coupled between a first terminal of the capacitor and a bias voltage, the second switch having a control input that is coupled to the input terminal of the timer circuit, the second switch being constructed to be conductive responsive to the delay circuit input signal having the second logic level and to be non-conductive responsive to the delay circuit input signal having the first logic level; and
a level translation circuit having a first input terminal coupled to the output terminal of the timer circuit, an output terminal, and first and second supply terminals adapted to receive first and second supply voltages, respectively, the level translation circuit comprising:
a bias circuit coupled to the first supply terminal and the output terminal of the level translation circuit, the bias circuit being constructed to bias the output terminal of the level translation circuit to at least one of the first supply voltage and the second supply voltage;
a third switch coupled between the second supply terminal and the bias circuit, the third switch having a control input that is coupled to the output terminal of the timer circuit, the third switch being constructed to be conductive responsive to the timer circuit output signal having a first logic level and to be non-conductive responsive to the timer circuit output signal having a second logic level; and
the output node coupled to the output terminal of the level translation circuit and at least one of the third switch and the bias circuit.

13. The delay circuit of claim 12 wherein the output node is coupled between the third switch and the bias circuit.

14. The delay circuit of claim 12 wherein the level translation circuit further comprises a second input terminal adapted to receive the delay circuit input signal.

15. The delay circuit of claim 12 wherein the control voltage comprises a positive voltage, the bias voltage comprises ground, the first switch comprises a PMOS transistor, and the second switch comprises an NMOS transistor, the PMOS and NMOS transistors having respective gates that are coupled to each other and to the input terminal of the timer circuit.

16. The delay circuit of claim 12 wherein the second supply voltage comprises ground, and wherein the third switch comprises a first NMOS transistor having a gate coupled to the output terminal of the timer circuit, a source coupled to ground, and a drain coupled to the output terminal of the level translation circuit.

17. The delay circuit of claim 16 wherein the bias circuit comprises:
an NMOS control transistor having a gate adapted to receive the delay circuit input signal, a source coupled to a bias voltage, and a drain;
a first PMOS transistor having a source coupled to the first supply terminal, a drain coupled to the drain of the NMOS control transistor, and a gate;
a second PMOS transistor having a source coupled to the first supply terminal, a drain coupled to the gate of the first PMOS transistor and the output terminal of the level translation circuit, and a gate coupled to the drain of the first PMOS transistor.

18. The delay circuit of claim 17 wherein the channel resistance of the second PMOS transistor is greater than the channel resistance of the first NMOS transistor.

19. The delay circuit of claim 12, further comprising a voltage regulator generating a reference voltage from one of the first and second supply voltages, the magnitude of the reference voltage being insensitive to variations in the first and second supply voltages, the reference voltage being coupled to the control input of the timer circuit.

20. The delay circuit of claim 12 wherein the first logic level comprises zero volts and the second input voltage comprises a positive voltage.

21. A delay circuit comprising:
a timer circuit operable to receive a reference voltage and an input signal, the timer circuit operable to generate a timer output signal responsive to the input signal, the timer output signal being generated after a delay corresponding to the magnitude of the reference voltage; and
a level translator circuit coupled to the timer circuit, the level translator circuit operable to receive the timer output signal, the input signal, a first supply voltage, and a second supply voltage, the level translator circuit operable to generate an output signal responsive to at least one of the timer output signal and the input signal, the output signal having a magnitude corresponding to one of the first and second supply voltages.

22. The delay circuit of claim 21 wherein the reference voltage comprises a fixed voltage generated by a circuit of regulated power supply.

23. The delay circuit of claim 21 wherein the reference voltage comprises a variable voltage having a magnitude corresponding to a desired delay value.

24. The delay circuit of claim 21 wherein the output signal corresponds to the first supply voltage when the input signal is low and corresponds to the second supply voltage when the input signal is high.

25. The delay circuit of claim 21 wherein the first supply voltage is of a magnitude less than the magnitude of the second supply voltage.

26. The delay circuit of claim 25 wherein the first supply voltage is ground and the second supply voltage is $V_{CC}$.

27. The delay circuit of claim 21 wherein the timer circuit comprises:
    a capacitor; and
    a switching circuit coupled to the capacitor, the switching circuit being operable to receive the reference voltage and the input signal, and operable to couple the capacitor to ground in response to the input signal being in a first state, and to couple the capacitor to the reference voltage in response to the input signal being in a second state, the delay output signal corresponding to the voltage across the capacitor.

28. The delay circuit of claim 27 wherein the first state of the input signal corresponds to a high input signal and the second state of the input signal corresponds to a low input signal.

29. The delay circuit of claim 21 wherein the level translator circuit is a circuit operable to generate the output signal responsive to the timer output signal when the input signal transitions from a first logic level to a second logic level, and operable to generate the output signal responsive to the timer output signal when the input signal transitions from the second logic level to the first logic level.

30. A delay circuit, comprising:
    a capacitor having a first plate and a second plate, the capacitor operable to produce a delay output signal, the delay output signal being the voltage at the first plate of the capacitor;
    a first NMOS transistor having a gate, a source, and a drain, the drain coupled to the first plate of the capacitor and the source coupled to a ground, the gate operable to receive an input signal, the first NMOS transistor being operable to couple the first plate of the capacitor to the ground in response to the input signal being relatively high; and
    a first PMOS transistor having a gate, a source, and a drain, the drain coupled to the first plate of the capacitor, the gate operable to receive the input signal, and the source operable to receive a reference voltage, the first PMOS transistor being operable to couple the reference voltage to the first plate of the capacitor in response to the input signal being relatively low;
    a second NMOS transistor having a gate, a source and a drain, the gate coupled to the first plate of the capacitor and operable to receive the delay output signal, and the source coupled to the first supply voltage;
    a second PMOS transistor having a gate, a source, and a drain, the drain coupled to the drain of the second NMOS transistor and the source coupled to the second supply voltage;
    a third PMOS transistor having a gate, a source, and a drain, the gate coupled to the drain of the second NMOS transistor and the source coupled to the second supply voltage; and
    a third NMOS transistor having a gate, a source, and a drain, the gate coupled to the input signal, the source coupled to the ground, and the drain coupled to the drain of the third PMOS transistor and to the gate of the second PMOS transistor.

31. The delay circuit of claim 30, further comprising an output node coupled to the drain of the second NMOS transistor, the output node operable to produce an output signal.

32. The delay circuit of claim 30, further comprising an output node coupled to the drain of the third NMOS transistor, the output node operable to produce an output signal.

33. A method of generating a delayed signal from an input signal, comprising:
    generating an intermediate signal that transitions between first and second output voltages responsive to transitions of the input signal between first and second logic levels, respectively, the intermediate signal being generated responsive to the input signal after a delay that is a function of the magnitude of a control voltage;
    translating the level of the intermediate signal having the first output voltage to the delayed signal having the magnitude of the first supply voltage; and
    maintaining the magnitude of the control voltage at a value independent of the magnitude of the first and second supply voltages.

34. The method of claim 33, further comprising translating the level of the intermediate signal having the second output voltage to the delayed signal having the magnitude of the second supply voltage.

35. The method of claim 33, further comprising translating the level of the input signal having the second input voltage to the delayed signal having the magnitude of the second supply voltage.

36. The method of claim 33 wherein the step of maintaining the magnitude of the control voltage at a value independent of the magnitude of the first and second supply voltages comprises maintaining the magnitude of the control voltage constant.

37. The method of claim 33 wherein the step of maintaining the magnitude of the control voltage at a value independent of the magnitude of the first and second supply voltages comprises adjusting the magnitude of the control voltage to correspond to a desired delay of the delayed signal from the input signal.

* * * * *